United States Patent
Mai et al.

(10) Patent No.: US 9,431,217 B2
(45) Date of Patent: Aug. 30, 2016

(54) MICROWAVE PLASMA GENERATING DEVICE AND METHOD FOR OPERATING SAME

(71) Applicant: MEYER BURGER (GERMANY) AG, Hohenstein-Ernstthal (DE)

(72) Inventors: Joachim Mai, Nobitz (DE); Hermann Schlemm, Jena (DE)

(73) Assignee: Meyer Burger (Germany) AG, Hohenstein-Ernstthal (DE)

( * ) Notice: Subject to any disclaimer, the term of this patent is extended or adjusted under 35 U.S.C. 154(b) by 0 days.

(21) Appl. No.: 14/395,557

(22) PCT Filed: Apr. 16, 2013

(86) PCT No.: PCT/IB2013/053006
§ 371 (c)(1),
(2) Date: Oct. 20, 2014

(87) PCT Pub. No.: WO2013/156924
PCT Pub. Date: Oct. 24, 2013

(65) Prior Publication Data
US 2015/0091442 A1 Apr. 2, 2015

(30) Foreign Application Priority Data
Apr. 19, 2012 (DE) .................. 10 2012 103 425

(51) Int. Cl.
*H01J 7/24* (2006.01)
*H01J 37/32* (2006.01)
*H05H 1/46* (2006.01)

(52) U.S. Cl.
CPC ...... *H01J 37/32211* (2013.01); *H01J 37/3222* (2013.01); *H01J 37/32229* (2013.01);
(Continued)

(58) Field of Classification Search
CPC .................. H01J 37/32211; H01J 37/32568; H01J 37/32669
USPC .................. 315/111.21, 111.25; 156/345.24
See application file for complete search history.

(56) References Cited

U.S. PATENT DOCUMENTS 5,062,508 A 11/1991 Ackermann et al.
6,194,835 B1 2/2001 Liehr
(Continued)

FOREIGN PATENT DOCUMENTS

CN 102160141 A 8/2011
CN 102378463 A 3/2012
(Continued)

*Primary Examiner* — Douglas W Owens
*Assistant Examiner* — Syed M Kaiser
(74) *Attorney, Agent, or Firm* — Laurence A. Greenberg; Werner H. Stemer; Ralph E. Locher

(57) ABSTRACT

A microwave plasma generating device has a plasma chamber. A microwave generating device is provided outside of the plasma chamber, and the microwaves are coupled into the plasma chamber via a microwave in-coupling device. The microwave in-coupling device has an inner conductor which leads into the plasma chamber through a chamber wall of the plasma chamber, an insulating tube which encloses the inner conductor and separates the inner conductor from an interior of the plasma chamber, and an outer conductor which leads into the plasma chamber through the chamber wall and which is coaxial to the inner conductor. The outer conductor has an outer conductor end in the plasma chamber. The inner and outer conductors form a microwave line, an outlet of microwaves out of the microwave line is provided in the plasma chamber to generate microwave plasma in the interior of the plasma chamber.

18 Claims, 6 Drawing Sheets

(52) U.S. Cl.
CPC .... *H01J37/32568* (2013.01); *H01J 37/32669* (2013.01); *H05H 1/46* (2013.01); *H01J 2237/3321* (2013.01); *H05H 2001/463* (2013.01); *H05H 2001/4637* (2013.01)

(56) References Cited

U.S. PATENT DOCUMENTS

| | | | |
|---|---|---|---|
| 6,831,259 | B2 | 12/2004 | Muegge et al. |
| 8,716,153 | B2 | 5/2014 | Lerch et al. |
| 2008/0100222 | A1* | 5/2008 | Lewington et al. ..... 315/111.21 |
| 2010/0101728 | A1* | 4/2010 | Iwasaki .................. 156/345.33 |
| 2010/0215541 | A1 | 8/2010 | Spitzl |
| 2011/0018443 | A1 | 1/2011 | Kou et al. |
| 2011/0030617 | A1 | 2/2011 | Biana |
| 2011/0057562 | A1* | 3/2011 | Chen et al. ..................... 315/39 |
| 2011/0076422 | A1 | 3/2011 | Stowell |
| 2011/0121735 | A1* | 5/2011 | Penny ..................... 315/111.21 |
| 2011/0135842 | A1* | 6/2011 | Faguet et al. ................. 427/569 |
| 2012/0064726 | A1* | 3/2012 | Nozawa et al. ............... 438/710 |
| 2012/0241090 | A1* | 9/2012 | Yoshikawa et al. ..... 156/345.41 |
| 2012/0267048 | A1* | 10/2012 | Moyama et al. ........ 156/345.33 |
| 2013/0256272 | A1* | 10/2013 | Zhao et al. ..................... 216/69 |

FOREIGN PATENT DOCUMENTS

| | | |
|---|---|---|
| DE | 3926023 A1 | 3/1990 |
| DE | 4136297 A1 | 5/1993 |
| DE | 19722272 A1 | 12/1998 |
| DE | 102006048815 A1 | 4/2008 |
| DE | 102008018902 A1 | 10/2009 |
| DE | 102008036766 A1 | 2/2010 |
| DE | 102010027619 B3 | 11/2011 |
| JP | 08296038 A | 11/1996 |
| TW | 201105183 A | 2/2011 |
| TW | 201130007 A | 9/2011 |
| WO | 03011696 A1 | 2/2003 |

\* cited by examiner

MICROWAVE PLASMA GENERATING DEVICE AND METHOD FOR OPERATING SAME

BACKGROUND OF THE INVENTION

Field of the Invention

The present invention relates to a microwave plasma generating device with a plasma chamber, at least one microwave generating device provided outside of the plasma chamber for generating of microwaves and a microwave incoupling device by which microwaves can be coupled into the plasma chamber, wherein the microwave incoupling device comprises an inner conductor leading into the plasma chamber through at least one chamber wall of the plasma chamber, an insulating tube enclosing the inner conductor and separating the inner conductor from an interior of the plasma chamber, and at least one outer conductor leading into the plasma chamber through the at least one chamber wall and being coaxial to the inner conductor but not being provided over the entire circumference of the inner conductor and having at least one outer conductor end in the plasma chamber, wherein the inner conductor and the outer conductor form a microwave line, and an outlet of microwaves out of the microwave line is provided in the plasma chamber in order to generate a microwave plasma in the interior of the plasma chamber. The invention further relates to a method for operating such a microwave plasma generating device.

Microwave plasma generating devices of said type are known in the state of the art, for instance, from the document DE 41 36 297 A1. The described microwave plasma generating device is used for the local production of plasma in a treatment chamber for substrates. Thereby, the used microwave incoupling device is led through a flange being provided in a chamber wall of the plasma chamber. The described microwave incoupling device comprises an outer hollow conduction guide of insulating material, in which an inner conductor of metal is provided, wherein the microwaves are coupled from a microwave generating device into the inner conductor. The propagation of the microwave is provided as coaxial wave type preferably in the space between the inner conductor and the generated plasma. Thereby, the microwaves further propagate inside the hollow conduction guide according to the laws of coaxial waveguides, wherein the enclosing plasma assumes the function of the outer conductor. By shielding the conduction waveguide at defined areas, the plasma zone being produced on the surface of the tube can be concentrated on desired areas. In such a case, the outer coat of the hollow conduction guide is formed of metal and thereby assumes the function of the outer conductor and prevents in this zone a release of microwaves into the evacuated areas of the treatment chamber, where plasma would have been produced otherwise.

With such a microwave plasma generating device, effective plasma treatments can be conducted due to the high producible plasma density. The microwave plasma generating devices can be operated pulsed or continuously. The pulses can be either adjusted in-phase or phase shifted to each other in a defined manner when pulsing the microwave power.

Plasma-enhanced CVD-depositions, for instance, can be provided with high deposition rates. Typically, at plasma-enhanced CVD-depositions with microwave plasma, the ion energy of the ions acting on the layer is relatively low. This can be very advantageous when using sensitive substrate surfaces, but occasionally results in a lower layer quality, for instance, when very thick layers shall be produced at simultaneously high deposition rates. A known method to increase the layer density is possible by increasing the ion energy by an electrical substrate bias accelerating the ions. In practice, the reliable setting of the desired substrate bias, however, especially proves to be difficult when moved substrate carriers and substrates are used.

BRIEF SUMMARY OF THE INVENTION

The object of the invention is, therefore, to provide a simple method for deposition of high-quality layers at high deposition rate and a corresponding device for implementing this method.

The object is solved, according to an aspect of the invention, by a microwave plasma generating device of the above mentioned type, wherein the microwave plasma is electrically contactable with at least one plasma electrode, which is provided in the interior of the plasma chamber, is coaxially to the inner conductor, is at least electrically insulated from the chamber wall, and is loadable with a DC, NF, or HF voltage so that the function of the outer conductor is transferable at least partly to the microwave plasma. According to the invention, by DC voltage a direct current voltage, by NF voltage an audio frequency, to say a voltage with a frequency of 20 to 20000 Hz, and by HF voltage a high frequency voltage, to say a voltage with a frequency of 3 MHz to about 300 GHz, is meant.

The outer conductor of a microwave line operated with high electric powers is preferably electrically grounded. By grounding, a simple technical structure and a high operational reliability of the microwave plasma generating device according to the invention are provided.

In the microwave plasma generating device of the invention, the outer conductor ends in the interior of the plasma chamber at the at least one outer conductor end. The microwave plasma is provided as electrical conductor in connection to the outer conductor end, wherein the microwave plasma assumes at least partly the function of the outer conductor to transmit the microwaves. The outer conductor end can be provided over the entire circumference of the microwave incoupling device or can only be provided partly around the circumference of the microwave incoupling device. Beginning from the outer conductor end, however, the outer conductor is disconnected at least partly so that no shielding is provided by the outer conductor itself in the disconnected area, which could prevent a release of microwaves from the inner conductor into the interior of the plasma chamber. The microwave plasma serves as replacement for the missing outer conductor behind the outer conductor end in the linear microwave plasma generating device.

The latter is done when the plasma of the microwave generating device reaches the cut-off-density, this plasma then becomes the high-conductible coaxial-outer-conductor of the microwave generating device. When this high-density plasma is isolatedly arranged to a possible "ground"-environment, this plasma can be used as new electrode for a low-pressure plasma. In return, the locking mechanism at the insulating tube of the microwave generating device is insulated from ground and the plasma electrode, which provides the contact to the microwave plasma, is connected to an outer voltage source.

Each generated plasma forms a plasma margin potential to interact with or enclose said plasma. Therefore, the plasma electrode cannot form a real ohmic contact to the microwave plasma. It is, therefore, important that the coupling plasma electrode surface is sufficiently sized in order to adjust a desired charge carrier current to the substrate.

The plasma electrode of the microwave plasma generating device of the invention is provided around the outer conductor, near the outer conductor end. This plasma electrode is electrically insulated from the chamber wall and from the outer conductor and can be loaded with a DC, NF, or HF voltage. Thus, in the microwave generating plasma device of the invention, the electrical properties of the microwave plasma are not only determined by the microwaves introduced by the microwave line but also by the DC, NF, or HF voltage applied to the plasma electrode.

Direct current voltage or alternating voltage can be used as voltage supply for the plasma electrodes. Thereby, the voltage supplies can be operated either continuously or pulsed. The frequency range of the alternating voltage is advantageously between around 50 Hz and 13.56 MHz. The actual choice is based on the technological demands and is not limited to the mentioned frequency range. In certain applications it can be advantageous when the microwave generating devices and the voltage supplies of the plasma electrode can be operated synchronized in time. This way, the substrate processing, for instance, can be provided with an ion bombardment with high ion energy or low ion energy as a sequence in time.

In conventional microwave plasma generating devices known from the state of the art, the microwave plasma is often directly connected to the grounded outer conductor respectively is in intense interaction with the surrounding walls, which are on ground potential, and, therefore also comprises a potential near to ground potential. Thereby, the microwave plasma cannot, even with an additional plasma electrode, be increased to a higher plasma potential. According to the invention, this disadvantage is compensated by consequently insulating the microwave plasma from surrounding and grounded walls, and by then applying a DC, NF, or HF voltage to the plasma electrode so that the potential difference between the microwave plasma and the substrate is increased, and ions from the microwave plasma impact on the substrates with higher energy. The ion energy adjustable this way provides, for instance, an increase of the layer density of the deposited layers and provides the overcoming of energetic barriers in self-healing processes of the layer. The plasma electrode is a stationary component of the microwave plasma generating device according to the invention. The plasma electrode can, therefore, be easily and reliable electronically connected.

With the plasma electrode, a similar technical effect such as with a substrate bias can be provided, only that the solution of the plasma electrode is more reliable and easy.

The microwave plasma used according to the invention is distinguished by an easy linear scalability. Compared to more low-frequency excitation frequencies, microwave plasmas can reach very high plasma densities, thus being particularly suitable for high rate processes. Furthermore, by the superposition of the microwave plasma with a low-frequency or high frequency discharge according to the invention it is possible to adjust a variable margin area potential against the ground reference. Thereby, the energy of ions impacting on the substrate surface can be freely adjusted to a certain degree. Since the generated microwave plasma of the microwave plasma generating device according to the invention is always generated at the outside diameter of the microwave incoupling device, a high-conductible electrode is always provided, which can assume the role of a new electrode to the ground reference. This also applies when insulating coatings grow on the dielectric insulating tube of the microwave incoupling device.

Preferably, in the microwave plasma generating device, which is formed as linear plasma source, the at least one outer conductor is grounded in the region of the chamber wall. Thus, the chamber wall and outer conductor can be of grounded metal. A particularly simple structure is provided for the microwave plasma generating device according to the invention when the joint of the outer conductor is on ground potential with the chamber wall. In this case, the outer conductor can be easily assembled, for instance, by means of a weld or screw connection. The outer conductor, however, must not be grounded in the region of the chamber wall, the outer conductor can also be provided, for instance, insulated from a conducting chamber wall or it can be mounted in an insulating chamber wall.

In another variant of the microwave plasma generating device, the outer conductor can also be connected to a voltage supply. Thereby, the outer conductor might be supplied with an alternating voltage of higher frequency or else be insulated from ground. In this case, a dielectric coupling of the microwave plasma could be provided by the outer conductor being inside the insulating tube. Thereby, the at least one outer conductor would provide the invention-related function of the plasma electrode and the plasma electrodes could basically be omitted.

In an advantageous embodiment of the microwave plasma generating device according to the invention, the at least one outer conductor is provided inside the insulating tube. The plasma chamber must be operated in an enclosed environment. To say, the plasma chamber must also be sealed in the region of the microwave line. The insulating tube is an advantageous solution for such a sealing. Tubes are generally solid components under mechanical loading caused by pressure differences from inside to outside and consequently well-suited for the usage in the microwave plasma generating device of the invention.

By arranging the outer conductor inside the insulating tube, said outer conductor is physically separated from the microwave plasma, and no layer deposition or other plasma impact occurs on the outer conductor. In this solution, the insulating tube serves as physical separation, and simultaneously as emission window for the microwaves from the interior of the insulating tube to the interior space of the plasma chamber being outside of the insulating tube.

According to a favorable embodiment of the microwave plasma generating device of the invention, the at least one outer conductor end is a straight tube end. In this embodiment, the microwave plasma forms a hollow-cylinder-shaped outer conductor around the inner conductor in connection to the outer conductor end. The microwave plasma is, in this case, not only located on the substrate side adverse to the inner conductor but also on the side of the inner conductor averted to the substrate. Such a microwave plasma generating device is, for instance, in plasma processes of advantage, in which a long exposure time of gas molecules in the microwave plasma is advantageous.

In an alternative embodiment of the microwave plasma generating device of the invention, the outer conductor is tubular-shaped with at least one stripe opening extending in the longitudinal direction of the outer conductor. In this embodiment, the tubular outer conductor comprises an opening extending in the longitudinal direction of same, which is a stripe-like recess in the hollow-cylinder-shaped outer conductor. The damping measure of the microwave in the microwave line can be influenced by the width and length of the stripe(s). The stripe can be further arranged spatially between the inner conductor and the substrate to be processed with the microwave plasma generating device, so that the microwave plasma is advantageously located near to a preferred area of the direct plasma processing.

In another particular suitable embodiment of the microwave plasma generating device of the invention, the chamber wall forms, at least in sections, the outer conductor. The outer conductor is not always a simple mechanical component, like a tube. Sometimes, for instance in the field of microwave distributions, the outer conductor can be also assembled mechanically complex of different components. In these cases, the chamber wall, for instance, can be used as a simple and cost-efficient fixing option for outer conductor components, thus forming in sections the outer conductor itself.

According to a preferred option of the microwave plasma generating device of the invention, the microwave line is led through two chamber walls being opposite to each other, wherein at the chamber walls, being opposite to each other in the plasma chamber, two plasma electrodes being opposite to each other are provided, between which the generation of microwave plasma is provided. In this embodiment of the invention, the microwave plasma in the outer areas of the plasma chamber is contacted by two electrodes.

To avoid the formation of undefined plasma in the area of the plasma electrodes, these are provided with a darkroom shielding according to the state of the art. Here it should be noted that the microwave plasma itself has no substantial contact to grounded components of the darkroom shielding.

In the center of the plasma chamber, the microwave plasma extends without interruptions across a large part of the width of the plasma chamber. It is possible to realize a large area of homogenous plasma processing by the uninterrupted microwave plasma. The microwave incoupling device can be mounted at the chamber walls in a simple and safe manner by the two ducts through across two chamber walls. If the microwave incoupling device comprises a closed tube sealed at the chamber walls, then a medium, for instance a cooling medium, can be further led through the tube. In other embodiments, the microwave incoupling device, however, can also be led through only one chamber wall ending in the interior of the plasma chamber.

In an advantageous embodiment of the microwave plasma generating device, the at least one plasma electrode is tubular-shaped, wherein the tube end of the plasma electrode is provided as electrical contact to the microwave plasma. The tubular-Shaped form of the plasma electrode is especially simple. The tubular-shaped plasma electrodes can be used either in combination with fully surrounding or in combination with different partially-surrounding outer conductor ends.

In a simple embodiment of the invention, the tube end of the plasma electrode can be straight formed. It is, furthermore, possible that the plasma electrode has a radius, which is continuously, gradual or discontinuously increasing. Thereby, different contacting surface areas of the plasma electrodes to the microwave plasma are reachable.

In an alternative to the above mentioned embodiment of the microwave plasma generating device of the invention, the plasma electrode is formed as a continuous tube with at least one plasma electrode opening extending in longitudinal direction in the jacket of the tube, wherein the microwave plasma is provided in the at least one plasma electrode opening. In this embodiment only one plasma electrode is used, which must therefore only be connected once. This plasma electrode comprises at least one plasma electrode opening, wherein the microwave plasma is connected at the edges of the plasma electrode opening. All other areas of the plasma electrode are at least partly provided with a darkroom shielding. At open areas of the darkroom shielding, defined areas can be provided for a plasma formation. These areas are then sustained predominantly with the respective voltage of the plasma electrodes.

This plasma electrode has to be arranged in such a way that the plasma electrode opening is accordingly fitted to the at least one outer conductor end. Shape, size, and position of the at least one plasma electrode opening hereby also provide control of the microwave plasma, which, for instance, can be used for providing a good processing homogeneity alongside the linear expansion of the microwave plasma generating device.

Preferably, the plasma electrode opening is provided between the inner conductor and the at least one substrate to be processed by the microwave plasma. Thereby, the microwave plasma is located near to the substrate, so that the applied microwave power can be used effectively for layer generation respectively other substrate processing.

In another advantageous embodiment of the microwave plasma generating device of the invention, the at least one plasma electrode is provided in such a distance to the chamber walls and to at least one substrate to be processed that at least one plasma is formable between the plasma electrode and the at least one substrate. In this developed embodiment, the plasma electrode is not only suitable for contacting the microwave plasma but instead, a plasma can be operated in the environment of the plasma electrode by applying a DC, NF, or HF voltage. This plasma can be used for different purposes, for instance, as support for the microwave plasma processes or for a cleaning process independent of the microwave plasma process.

In a particular preferred advancement of the above described embodiment of the microwave generating device of the invention, the plasma is formable as part of the electrical contact between the plasma electrode and the microwave plasma. The electrical contact properties of the physical plasma electrode can be, for instance, altered by coating in continuous operation. Such an alteration can be decreased or even prevented if the microwave plasma is not only contacted by the physical plasma electrode but also by the plasma itself.

In another embodiment, the microwave plasma generating device of the invention comprises at least one gas-permeable plasma screen and/or at least one magnet arrangement for shaping the microwave plasma. With the plasma screen and/or the magnet arrangement, different plasma parameters, such as the plasma geometry, the plasma density, and/or the ion exposure time, can be directly adjusted to the existing requirements in the plasma. Thereby, a further improvement of the layer quality and/or an increase of the process efficiency can be achieved.

The object of the invention is solved, according to a second aspect, by a method of operation of a microwave plasma generating device, wherein microwaves of a microwave generating device provided outside of a plasma chamber of the microwave plasma generating device are coupled into the plasma chamber by a microwave incoupling device, wherein the microwave incoupling device comprises an inner conductor which leads into the plasma chamber through at least one chamber wall of the plasma chamber, an insulating tube which encloses the inner conductor and separates the inner conductor from an interior of the plasma chamber, and at least one outer conductor which leads into the plasma chamber through the at least one chamber wall, is coaxial to the inner conductor but is not provided over the entire circumference of the inner conductor, and which comprises at least one outer conductor end in the plasma chamber, wherein the inner conductor and the outer conductor form a microwave line, an outlet of microwaves out of the microwave line is provided in the plasma chamber in order to generate a microwave plasma in the interior of the plasma chamber, and wherein at least one plasma electrode which is electrically insulated from the chamber wall and to which a DC, NF, or HF voltage can be applied is provided in the interior of the plasma chamber coaxially to the inner conductor and which contacts the plasma electrode electrically, wherein a microwave power is transferred in a microwave line and is used for a ionization of the microwave plasma, so that the function of the outer conductor is transferred at least partly to the microwave plasma, wherein the electrical potential of the microwave plasma is applied to the at least one plasma electrode by the DC, NF, or HF voltage.

With this method, on the one hand, a microwave plasma is generated by the transport of electrical microwave power into the plasma chamber, which results in a high charge carrier density, thereby causing a high plasma efficacy, for instance, for a fast plasma layer deposition. Furthermore, in the invention-related method, this microwave plasma is electrically contacted by the at least one plasma electrode and coupled with a DC, NF, or HF voltage. Thereby, the electrical potential of the microwave plasma is shifted in comparison to the substrate potential so that ions fastened by the potential difference achieve a desired energy, developing an advantageous impact when hitting a substrate to be processed.

In a favorable embodiment of the invention-related method, the electrical potential of the microwave plasma is adjusted relatively to at least one grounded substrate or relatively to at least one substrate at bias potential. The shift of potential of the microwave plasma via the plasma electrode is regarded, for a start, as alternative measure for a basically similar shift potential of the substrate. Independent of the influence of the microwave plasma via the plasma electrode, however, the potential of the substrate, also called bias potential, can be additionally adjusted. By this additional option, the potentials of the microwave plasma and of the substrate can be brought in relation to each other. Thereby, these potentials can be, for instance, adjusted symmetrically to ground potential in an advantageous manner.

BRIEF DESCRIPTION OF THE SEVERAL VIEWS OF THE DRAWING

Preferred embodiments of the present invention, their arrangement, function, and advantages are in the following described by figures in more detail, wherein FIG. 1 schematically shows a cross section of an embodiment of an invention-related microwave plasma generating device alongside its linear expansion.

DESCRIPTION OF THE INVENTION

Figure 1:
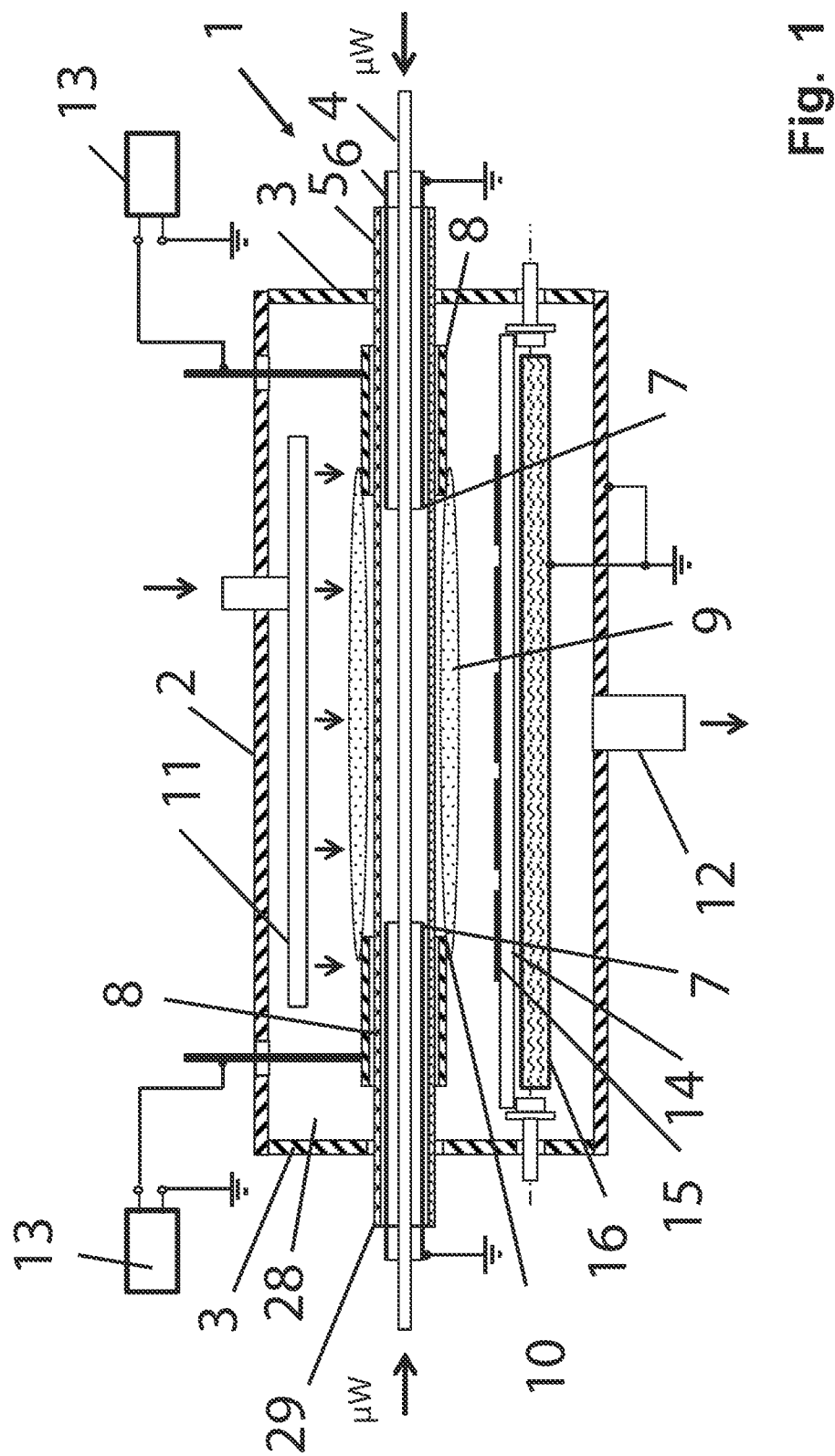

FIG. 1 schematically shows a vertical cross section of an embodiment of an invention-related microwave plasma generating device 1 with a plasma chamber 2 alongside the linear expansion of the microwave plasma generating device 1. In practice, the invention-related microwave plasma generating device 1 can also be called plasma source in simplified terms.

The plasma chamber 2 comprises an interior 28, in which a microwave incoupling device 29 is led through a chamber wall 3 of the plasma chamber 2, and which is led through an opposite chamber wall 3 out of the plasma chamber 2. Accordingly, the microwave incoupling device 29 has a linear dimension, which is larger than the dimension of the plasma chamber 2.

In the shown embodiment, the microwave incoupling device 29 is provided parallel to substrates 15 being applied horizontally on a substrate carrier 14 and to be processed with the microwave plasma generating device 1. In the shown embodiment, the substrate carrier 14 is provided on transport rollers 27, and is transportable on the transport rollers 27 vertically to the presentation level. In reality, the transport level is horizontally aligned.

In other, not-shown embodiments of the invention, the substrates 15 are not applied horizontally but are fixed otherwise, for instance, in vertical direction. In these not-shown embodiments, the microwave incoupling device 29 is provided differently, for instance, vertically, in the respective plasma chamber. Furthermore, in other not-shown embodiments of the present invention, another carrier device for the substrates 15 and/or a different transport system for the substrates 15 or a new simple carrier can be used for the substrates 15.

The microwave incoupling device 29 is coupled with a here not separately shown microwave plasma generating device provided outside of a plasma chamber 2 which can generate the microwaves μW.

The microwave incoupling device 29 comprises a linear extending inner conductor 4. The inner conductor 4, which is made of an electrically conductive material such as metal, is provided inside of an insulating tube 5, which encloses the inner conductor 4 and separates the inner conductor from the interior 28 of the plasma chamber 2. The insulating tube 5 is made of an electrically non-conductive material, for instance, a dielectrical material, such as glass or oxide ceramic.

In the embodiment shown in FIG. 1, at both sides of the plasma chamber 2, an outer conductor 6 of an electrically conductive material such as metal is provided coaxially around the inner conductor 4. Thereby, the inner conductor 4 and the outer conductor 6 are electrically insulated from each other. The outer conductor 6 leads, like the inner conductor 4, from outside the plasma chamber 2 into the interior 28 of the plasma chamber 2, and ends inside of the interior 28 at an outer conductor end 7. Hence, in the embodiment shown in FIG. 1, two outer conductor ends 7 are provided opposite to each other, wherein no outer conductor 6 is provided coaxially around the inner conductor 4 between the outer conductor ends 7. Since no electrical shield is provided in the space between the outer conductor ends 7, in this space the microwaves μW, which have been directed through the inner conductor 4, are directly released from the inner conductor 4 into the interior 28 of the plasma chamber 2.

Furthermore, shown in the embodiment in FIG. 1, a plasma electrode 8 is provided around the insulating tube 5, which is coaxial to the inner conductor 4 and provided at both sides of the plasma chamber 2, each ending in the interior 28 of the plasma chamber 2, and being loadable with a DC, NF, or HF voltage, respectively. Therefore, each plasma electrode 8 is connected to a voltage supply 13. The required connection lines are provided with a plasma shielding, according to the state of the art, inside of the plasma chamber 2 to prevent a generation of undefined plasma. The plasma shielding can be realized, for instance, by means of a dark room shielding.

As shown in FIG. 1, a microwave plasma 9 is provided inside of the interior 28 of the plasma chamber 2. Thereby, the inner conductor 4 and the outer conductor 6 form a microwave line for an introduction of the microwaves μW into the plasma chamber 2 to feed the microwave plasma 9. The microwave plasma 9 extends between the plasma electrodes 8 around the inner conductor 4, which is not enclosed by the outer conductor 6. Thereby, a DC, NF, or HF voltage can be applied to the plasma electrodes 8. The coupling of the NF or HF voltage from the plasma electrodes 8 to the microwave plasma 9 is provided at electrical contacts 10. The plasma electrodes 8 should be provided, at least partly, with darkroom shieldings which are not shown here.

The plasma electrodes 8 are formed as tubular-shaped electrodes in the embodiment of FIG. 1. To improve the electrical contacts to the microwave plasma 9, the radius of the tubular-shaped ends of the plasma electrodes 8 can also increase, for instance, continuously, gradually, or functionally different in dependence of a defined length or defined lengths. Thereby, different contacting surface areas of the plasma electrodes 8 to the microwave plasma 9 can be reached.

Inside of the plasma chamber 2, the function of the outer conductor 6 is transferred at least over a part of the linear expansion to the microwave plasma 9. Thereby, a microwave line is provided alongside the linear expansion of the microwave incoupling device 29 in spite of the lack of a physical outer conductor 6 in this section.

In the embodiment of FIG. 1, the outer conductors 6 provided at both sides of the plasma chamber 2 of the microwave plasma generating device 1 are formed as tube-shaped outer conductors 6, which are grounded and extending until the outer conductor ends 7 in the plasma chamber. On the contrary, the inner conductor 4 extends over the entire linear expansion of the microwave generating device 1. The inner conductor 4 and the outer conductor 6 form a microwave line for the microwaves μW coupled into the inner conductor 4. At the outer conductor ends 7, the microwaves μW can exit the microwave line into the plasma chamber due to the missing outer conductor 6.

Furthermore, in the plasma chamber 2, an inlet of gases into the plasma chamber 2 by a gas shower 11 is provided, which are suitable for the generation of a required plasma. The amount of the gases introduced by the gas shower 11 and the gases led out by a pump line 12 are dosed in such a manner that a dynamically adjustable pressure, suitable for generating microwave plasma 9, is provided in the plasma chamber 2. By the penetration of the microwaves μW into the interior 28 of the plasma chamber 2, the gas contained therein is ionized, and an electrically conductive microwave plasma 9 is provided. The microwave plasma 9 acts like an electrical conductor, to which—after the outer conductor ends 7—the function of the missing outer conductor 6 is transferred at least partly, and which causes a transfer of the microwaves μW through the plasma chamber 2.

In the microwave plasma generating device 1 of the invention, the microwave plasma 9 is insulated from the outer conductor end 7. A proper electrical contact 10, however, is provided to the plasma electrodes 8, which are electrically insulated from the chamber walls 3 of the plasma chamber 2. The plasma electrodes 8 are concentrically provided outside of the outer conductor 6 in the shown embodiment. The plasma electrodes 8 are provided axially, which is related to the axis of the microwave incoupling device 29, until shortly before the outer conductor ends 7.

In other not-shown embodiments, it is basically possible to couple the microwave plasma 9 capacitive by the outer conductors 6. The latter objective requires that the outer conductors 6 are self-insulated from ground, and are connected to the voltage suppliers 13. In this case, the outer conductors 6 could be provided as plasma electrodes 8, and the plasma electrodes 8 shown in FIG. 1 could be omitted. This variant, however, is technically high-demanding particularly since no supply of direct current voltages of the outer conductors 6 is possible, and even a supply with alternating voltages is limited to higher frequencies.

In the embodiment shown in FIG. 1, the plasma electrodes 8 are each connected to a voltage supply 13, for instance, to a HF source. The potential difference between the microwave plasma 9 and the chamber walls 3 and the substrates 15 can be regulated by the voltage generated by the voltage supply 13. This way, the energy of ions, which impact on the substrates 15 out of the microwave plasma 9, can be adjusted. Thereby, in return, an advantageous impact from the microwave plasma 9 onto the substrates is reachable.

In the embodiment of FIG. 1, a plasma-enhanced chemical vapor deposition is provided in the plasma chamber 2. The microwave plasma 9 has a high density of ions and electrodes, thus causing an intensive fragmentation and excitation of the processing gas. A HF voltage is generated by the voltage sources 13, respectively, by which a sufficiently large ion bombardment of the deposited layers is guaranteed, so that the layers grow at high speed and at high quality on the substrates 15.

In other not-shown embodiments, the plasma chamber 2 is not a deposition chamber, but a plasma treatment chamber or a plasma etching chamber.

In the embodiment shown in FIG. 1, the substrate carrier 14 and the substrates 15 applied thereon are heatable by a heater 16. The heater 16 can be provided, according to the desired temperature range, differently, for instance as heating plate or as radiation heater.

Presently, the heater 16 is a grounded heating plate which simultaneously forms a capacitive grounding for the substrate carrier 14 and the substrates 15.

Figure 2:
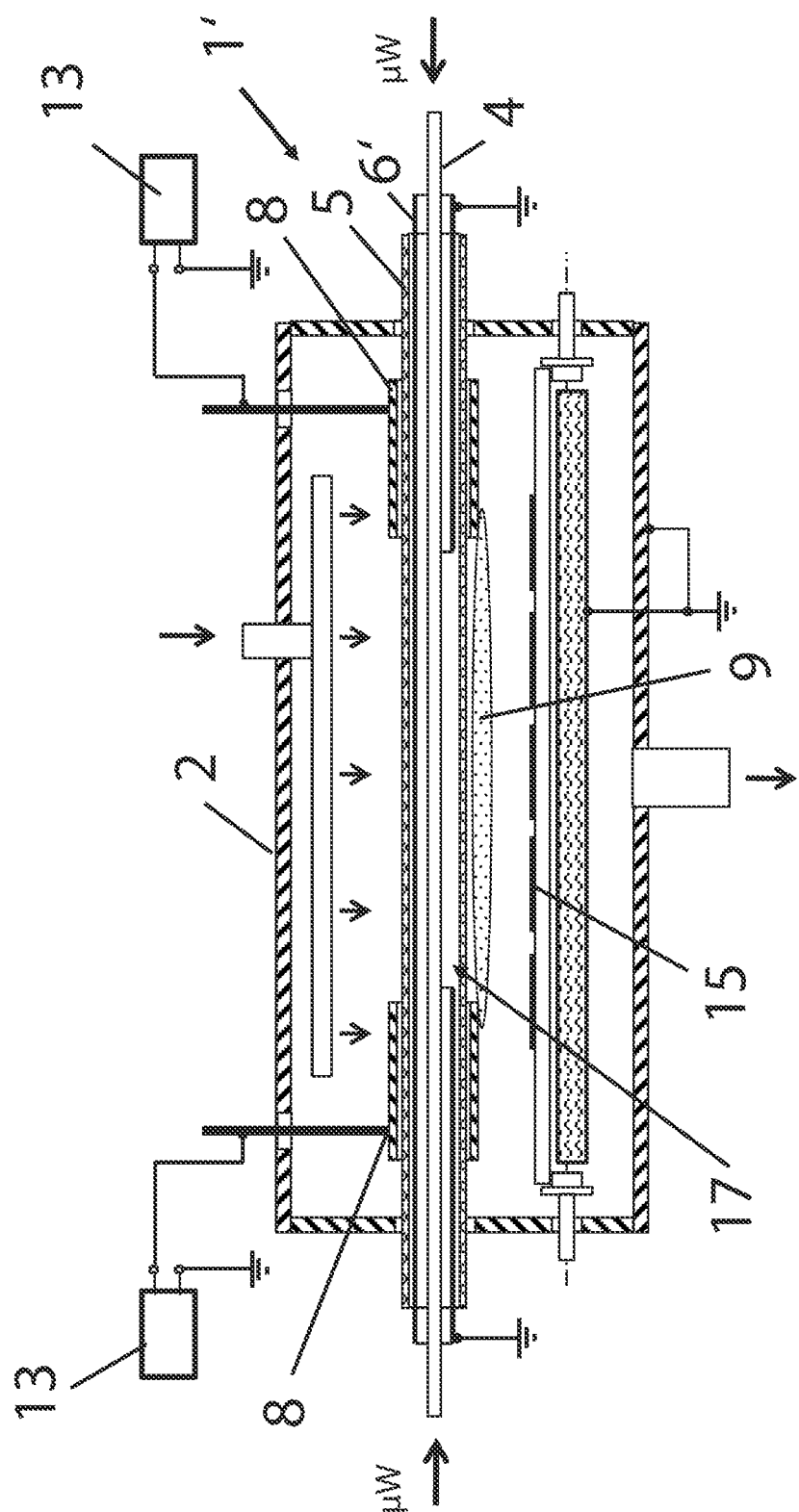
FIG. 2 schematically shows a cross section of another embodiment of an invention-related microwave plasma generating device.

FIG. 2 schematically shows another embodiment of the microwave plasma generating device 1' in a cross section over a linear expansion of this microwave plasma generating device 1'. In contrast to the microwave plasma generating device 1, which has been shown in FIG. 1, the outer conductor 6' of this embodiment is provided over the entire plasma chamber 2 in the upper half of the picture. This outer conductor 6' only comprises a stripe opening 17 at the side facing the substrates 15. Thereby, the microwave power cannot escape from the whole circumference of the inner conductor 4, but escapes only from a part of the circumference of the inner conductor 4. Accordingly, the microwave plasma 9 does not completely form over the whole circumference of the inner conductor 4, but forms only over a part of the circumference between the inner conductor 4 and the substrates 15. In this embodiment, the used microwave power can be used for a defined, smaller volume range for the plasma generation, whereby a locally increased charge carrier density is reached. Thereby, the processing gases and the microwave power are used to a larger degree for the coating of the substrates 15 than in the embodiment of FIG. 1. The locally increased charge carrier density in FIG. 2 can be used, for instance, for the generation of an increased ion current in the direction of the substrate processing.

The embodiment of FIG. 2, however, is not generally more favorable than the embodiment of FIG. 1. For instance, the longer activation time of the gases, connected to microwave plasma 9 of FIG. 1, can be advantageous for a deposition.

The angular alignment of the stripe opening 17 in relation to the substrates 15 can be optionally adjusted. In FIG. 2, the outer conductor 6 can also be used as to a plasma electrode by separating it from the ground and connecting it to a voltage supply such as the voltage supply 13. Then, in return, the separately provided plasma electrodes 8 of the embodiment in FIG. 2 are omitted.

Figure 3:
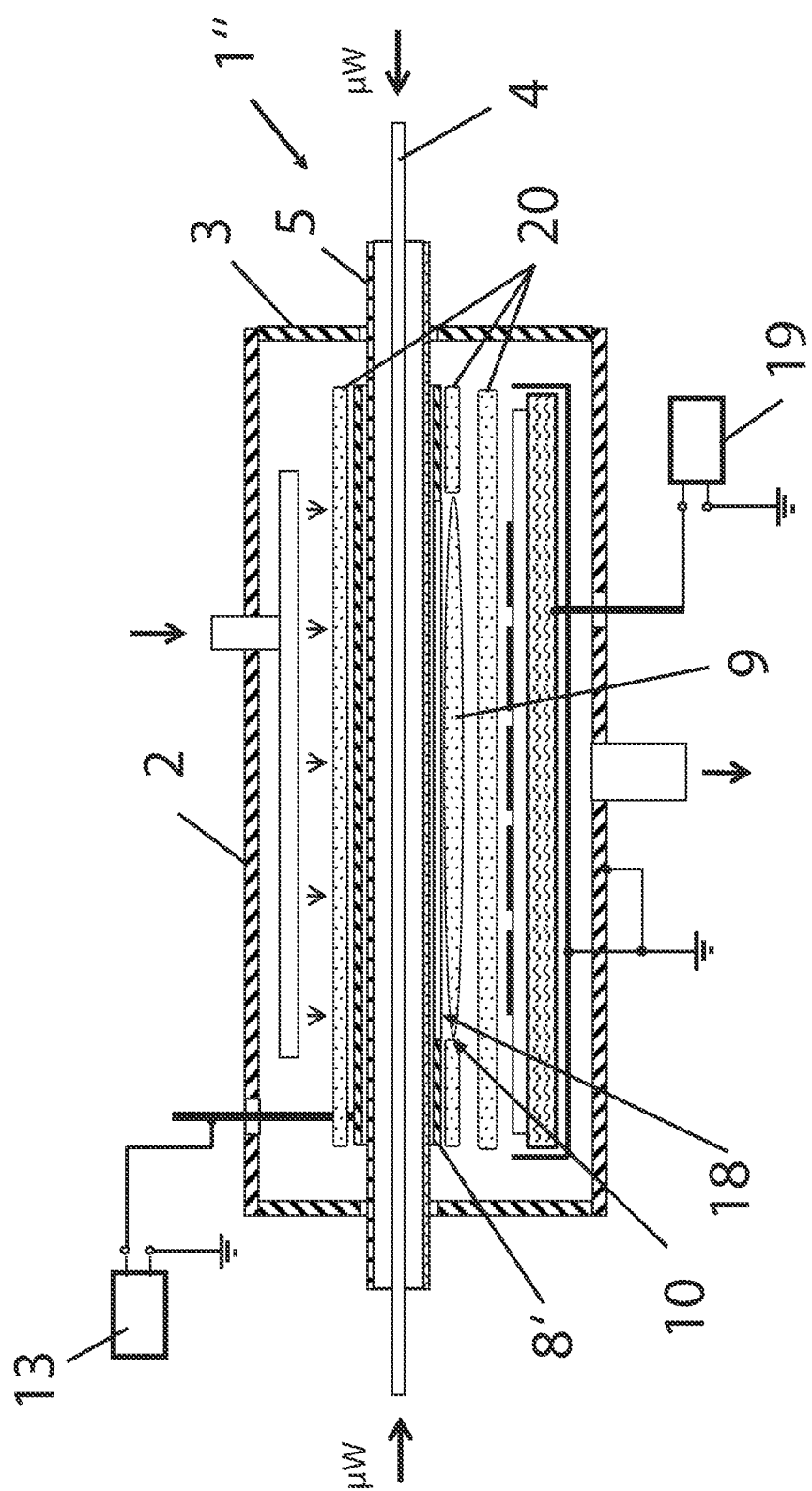
FIG. 3 schematically shows a cross section of yet another embodiment of an invention-related microwave plasma generating device.

FIG. 3 schematically shows another embodiment of a microwave plasma generating device 1' of the invention. The microwave plasma generating device 1" only comprises a single plasma electrode 8' in contrast to the previous embodiments. In the shown embodiment, the plasma electrode 8' is a tube with a plasma electrode opening 18 extending in longitudinal direction of the tube. By the voltage applied on the plasma electrode 8', a plasma 20 can be ignited in the plasma chamber 2 independent of the microwave plasma 9.

The microwave plasma generating device 1" is basically also combinable with the outer conductors 6 of the embodiment of FIG. 1. Thereby, an outlet of microwaves in the area between the chamber walls 3 and the plasma electrode 8 through the insulating tube 5 will be prevented.

In FIG. 3, an option of the invention is shown, according to which the microwave plasma generating device 1" of the invention is usable for the treatment of substrates 15, which are connectable with a bias. In technical language, the terms substrate bias and substrate bias voltage are used as synonyms. The substrate bias generator 19 is used for generating the substrate bias voltage. As a result of the substrate bias voltage, the plasma 20 outlined in front of the substrate carrier 14 in FIG. 3 can be generated in the plasma chamber 2.

Figure 4:
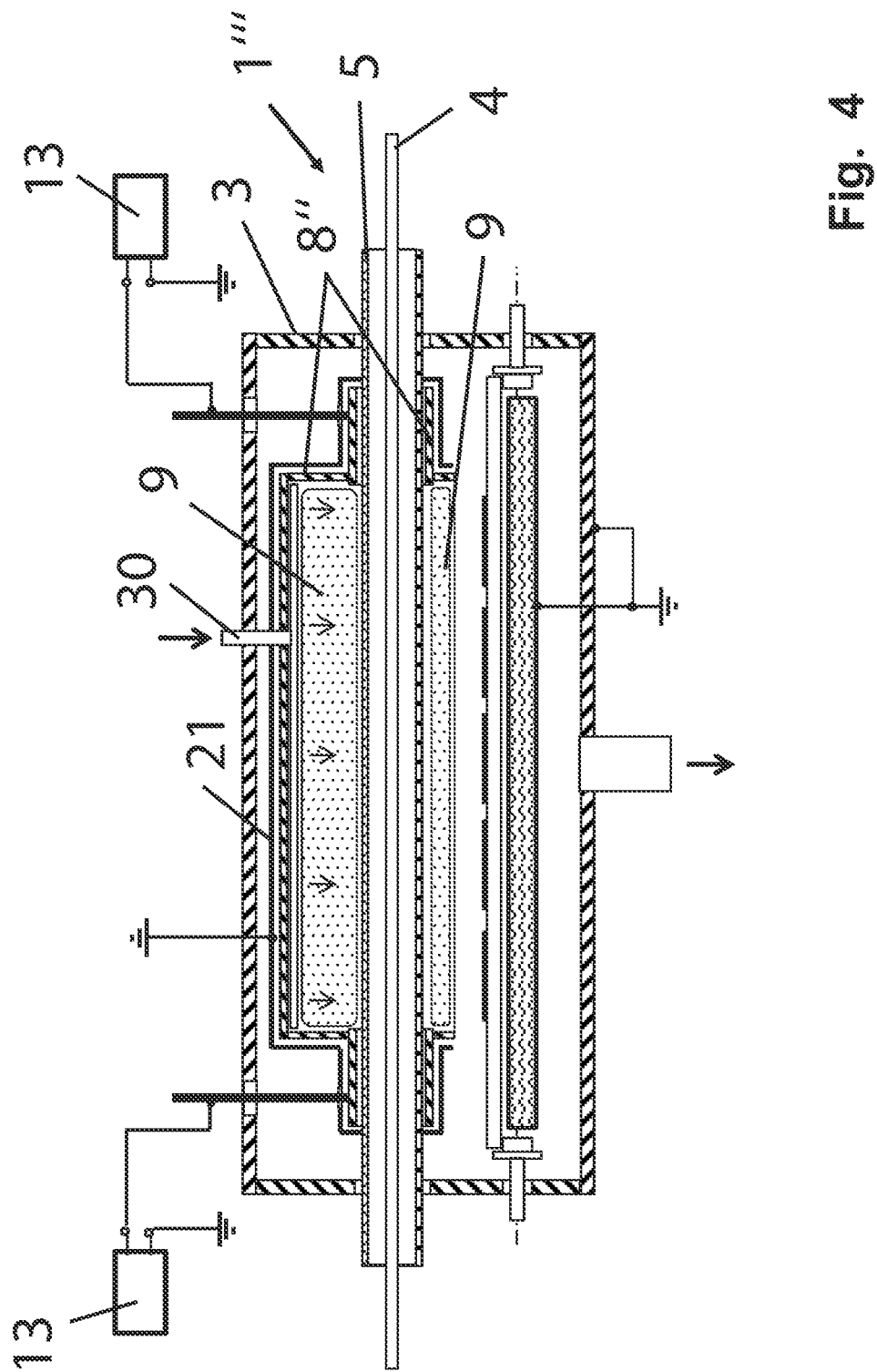
FIG. 4 schematically shows a cross section of another embodiment of an invention-related microwave plasma generating device.

FIG. 4 shows another embodiment of a microwave plasma generating device 1''' of the invention in a vertical cross section along a linear expansion of this microwave plasma generating device 1'''. In this embodiment, a plasma electrode 8" is used, comprising a large surface, thus being able to carry larger charge carrier currents. The generated microwave plasma 9 fills the space between the plasma electrode 8" and the insulating tube 5, and nearly reaches the potential of the plasma electrode 8".

The microwave plasma generating device 1''' comprises a grounded shielding 21, which is located at a small distance to the plasma electrode 8". Thereby, the distance must be smaller than the length of the dark room under the chosen process conditions so that no plasma is ignited between the plasma electrode 8" and the grounded shielding 21. The grounded shielding 21 and the plasma electrode 8" provide a spatial limitation of the microwave plasma 9 and its separation from the chamber walls 3.

The schematically indicated gas inlet 30 in FIG. 4 must be provided partly insulated from the chamber wall 3. Therefore, it can be advantageous when the gas inlet 30 is also simultaneously used as DC, NF, or HF supply to the plasma electrode 8".

The microwave plasma 9 shown in FIG. 4 comprises a much defined volume, whereby gases introduced therein can be removed intensively and efficiently. Thereby, the microwave plasma generating device 1''' is particularly suitable for high rate processes with simultaneous high ion current density to the substrate.

The embodiment of FIG. 4 also comprises outer conductors 6 which are provided around the inner conductor 4 and electrically insulated from said. Thereby, a defined microwave transport to the opening area, in which the microwave plasma 9 shall be generated, is reached.

Figure 5:
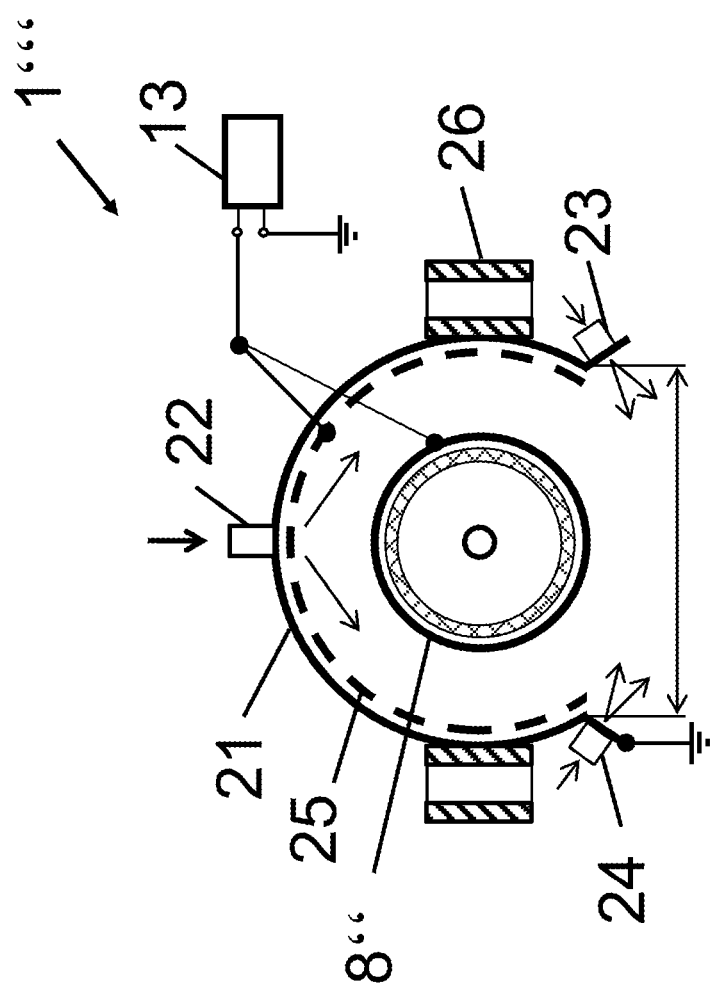
FIG. 5 schematically shows a cross section of the microwave plasma generating device of FIG. 4 transverse to the linear expansion.

FIG. 5 shows the microwave plasma generating device 1''', in contrast to FIG. 4, in a cross section transverse to the linear expansion of the microwave plasma generating device 1'''.

The microwave plasma generating device 1''' comprises a gas inlet 22 for a first process gas and gas inlets 23 and 24 for a second process gas. By the different inlet positions of the gas inlets 22, 23, 24, the holding time of the introduced gases is determined in the microwave plasma 9 of the linear microwave plasma generating device 1'''. The gas from the gas inlet 22 stays longer in the microwave plasma 9, thus can be stronger activated and removed as when using an inlet through the gas inlets 23, 24.

For instance, in a silicon nitride deposition, ammonia can be inserted by the gas inlet 22 and silane gas can be inserted accordingly by the gas inlets 23 and 24. The plasma electrode 8", which is applied to the voltage supply 13, is electrically conductive and connected to a gas-permeable plasma screen 25 so that the plasma screen 25 is part of the plasma electrode 8". The gas-permeable plasma screen 25 is enclosed by the grounded shielding 21, wherein a dark room is provided in the space between, in which it is not possible to generate plasma, but an unhindered gas transport into the room between plasma screen 25 and plasma electrode 8" can be provided.

The microwave plasma generating device 1''' further comprises magnet arrangements 26, which are necessary for the shaping of the geometry of the plasma 20. The alignment of the magnet poles of the magnet arrangement 26 can be done in such a manner that the magnet fields, outgoing from the opposite magnet poles, are either attractive or repulsive. If, for instance, same magnet poles are positioned opposite each other than far-ranging magnet fields in direction of the substrate surface are formed. The generated plasma is thereby compressed in direction of the substrate surface. If the alignment of the opposite magnet poles is attractive than the generated plasma is virtually locked and compressed in a magnetic bottle, inside of the microwave generating device 1'''. The carrier charge supply in direction to the substrate 15 is thereby decreased. The opposite magnet arrangements 26 can be presented as and arranged along the grounded shielding 21 for the further shaping of the magnet fields but also on other defined positions.

Figure 6:
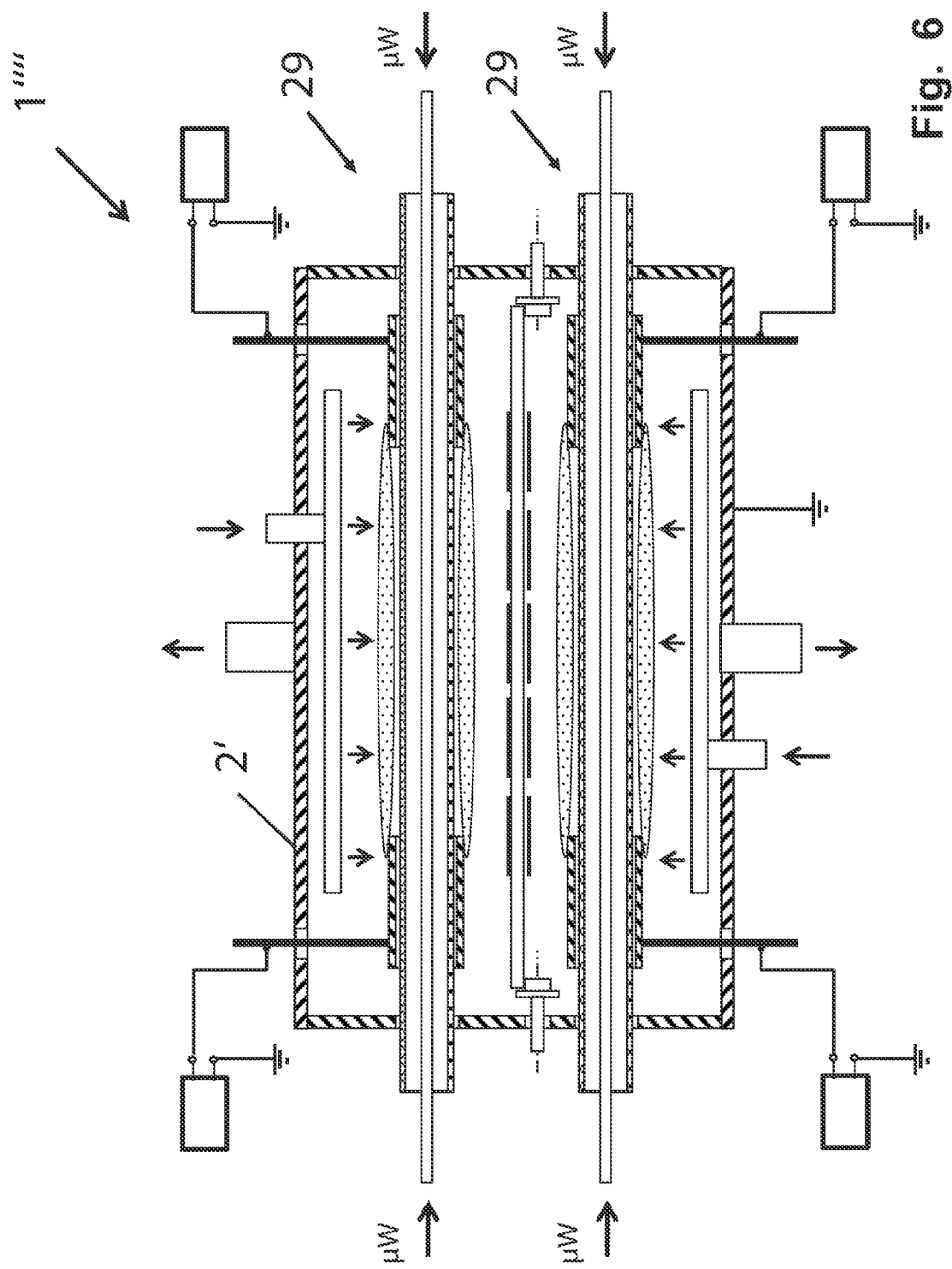
FIG. 6 schematically shows an invention-related microwave plasma generating device with two microwave incoupling devices provided at both sides of substrates.

FIG. 6 shows a vertical arrangement of two microwave incoupling devices 29 of a microwave plasma generating device 1'''' of the invention from both sides of substrates 15 in a plasma chamber 2'. In the plasma chamber 2', the two illustrated microwave incoupling devices 29 are simultaneously active in order to process twice as many substrates 15 per unit of time than in the above mentioned microwave plasma generating devices 1, 1'. 1", 1'''. Alternatively, in this plasma chamber 2', substrates 15 can be coated on both sides, wherein, in this case, a substrate carrier must be used which allows a substrate coating from both sides of the substrate.

The invention claimed is:

1. A microwave plasma generating device, comprising:
   a plasma chamber having chamber walls;
   at least one microwave generating device for generating microwaves disposed outside of said plasma chamber;
   a microwave in-coupling device with which the microwaves are coupled into said plasma chamber, said microwave in-coupling device having an inner conductor leading into said plasma chamber through at least one of said chamber walls of said plasma chamber, an insulating tube enclosing said inner conductor and separating said inner conductor from an interior of said plasma chamber, and at least one outer conductor with at least one outer conductor end leading into said plasma chamber through at least one of said chamber wall, said at least one outer conductor being coaxial to said inner conductor but is not provided over an entire circumference of said inner conductor, said inner conductor and said at least one outer conductor form a microwave line and an outlet of microwaves out of the microwave line in said plasma chamber to generate microwave plasma in said interior of said plasma chamber; and
   at least one plasma electrode disposed in said interior of said plasma chamber and electrically insulated from said chamber walls and to which a DC, NF, or HF voltage can be applied, said at least one plasma electrode disposed coaxially to said inner conductor, wherein the microwave plasma is electronically contactable with said at least one plasma electrode so that a function of said at least one outer conductor is transferable at least partly to the microwave plasma, said at least one plasma electrode selected from the group consisting of:
      a tubular shaped plasma electrode disposed around said insulating tube being coaxial to said inner conductor and having two plasma electrode elements, each of said plasma electrode elements disposed at one side of said plasma chamber and each ending in an interior of said plasma chamber; and
      a single, tubular plasma electrode with a plasma electrode opening formed therein and extending in a longitudinal direction of said tubular plasma electrode.

2. The microwave plasma generating device according to claim 1, wherein said at least one outer conductor is grounded in a region of said chamber walls.

3. The microwave plasma generating device according to claim 1, wherein said at least one outer conductor is connected to an alternating voltage source.

4. The microwave plasma generating device according to claim 1, wherein said at least one outer conductor is provided inside of said insulating tube.

5. The microwave plasma generating device according to claim 4, wherein said at least one outer conductor end is a straight tube end.

6. The microwave plasma generating device according to claim 4, wherein said at least one outer conductor is tube-shaped with at least one stripe opening extending in a longitudinal direction of said at least one outer conductor.

7. The microwave plasma generating device according to claim 1, wherein at least one section of one of said chamber walls forms a part of said at least one outer conductor.

8. The microwave plasma generating device according to claim 1, wherein
   said microwave line is led through two of said chamber walls being opposite to each other, and in said plasma chamber, at said chamber walls being opposite to each other, said plasma electrode elements being opposite to each other and between which the generation of the microwave plasma is provided.

9. The microwave plasma generating device according to claim 1, further comprising a darkroom shielding disposed around said at least one plasma electrode.

10. The microwave plasma generating device according to claim 1, wherein said tubular shaped plasma electrode has tube ends, and one of said tube ends of said tubular shaped plasma electrode, respectively, is provided as an electrical contact to the microwave plasma.

11. The microwave plasma generating device according to claim 1, wherein said tubular plasma electrode is formed as a continuous tube with a jacket and said plasma electrode opening extending in a longitudinal direction in said jacket of said continuous tube, wherein the microwave plasma is disposed in said at least one plasma electrode opening.

12. The microwave plasma generating device according to claim 11, wherein said plasma electrode opening is disposed between said inner conductor and at least one substrate to be processed by the microwave plasma.

13. The microwave plasma generating device according to claim 1, wherein said at least one plasma electrode is disposed at such a distance to said chamber walls and at least one substrate to be processed, that a plasma is producible between said at least one plasma electrode and the at least one substrate.

14. The microwave plasma generating device according to claim 13, wherein the plasma is producible as part of electrical contact between said at least one plasma electrode and the microwave plasma.

15. The microwave plasma generating device according to claim 1, further comprising at least one of at least one gas-permeable plasma screen or at least one magnet configuration arrangement for shaping the microwave plasma.

16. A microwave plasma generating device, comprising:
   a plasma chamber having chamber walls;
   at least one microwave generating device for generating microwaves disposed outside of said plasma chamber;
   a microwave in-coupling device with which the microwaves are coupled into said plasma chamber, said microwave in-coupling device having an inner conductor leading into said plasma chamber through at least one of said chamber walls of said plasma chamber, an insulating tube enclosing said inner conductor and separating said inner conductor from an interior of said plasma chamber, and at least one outer conductor with at least one outer conductor end leading into said plasma chamber through at least one of said chamber wall, said at least one outer conductor being coaxial to said inner conductor but is not provided over an entire circumference of said inner conductor, said inner conductor and said at least one outer conductor form a microwave line and an outlet of microwaves out of the microwave line in said plasma chamber to generate microwave plasma in said interior of said plasma chamber; and
   at least one plasma electrode disposed in said interior of said plasma chamber and electrically insulated from said plasma chamber walls and to which a DC, NF, or HF voltage can be applied, said at least one plasma electrode disposed coaxially to said inner conductor, wherein the microwave plasma is electronically contactable with said at least one plasma electrode so that a function of said at least one outer conductor is transferable at least partly to the microwave plasma, said at least one plasma electrode being tubular-shaped and having tube ends, and one of said tube ends of said at least one plasma electrode, respectively, is provided as an electrical contact to the microwave plasma, a radius of at least one of said tube ends is continuously, gradually, or discontinuously increasing.

17. A method for generating plasma, which comprises the steps of:
providing a microwave plasma generating device having a plasma chamber;
providing at least one microwave generating device disposed outside of the plasma chamber of the microwave plasma generating device, the microwave generating device outputting microwaves being coupled into the plasma chamber by at least one microwave in-coupling device leading through at least one chamber wall into the plasma chamber, the microwave in-coupling device containing an inner conductor leading into the plasma chamber through at least one chamber wall of the plasma chamber, an insulating tube enclosing the inner conductor from an interior of the plasma chamber, and at least one outer conductor having at least one outer conductor end leading into the plasma chamber through the at least one chamber wall and coaxial to the inner conductor but not provided over an entire circumference of the inner conductor, the inner conductor and the at least one outer conductor forming a microwave line and an outlet of microwaves out of the microwave line in the plasma chamber to generate a microwave plasma in the interior of the plasma chamber;
providing in the interior of the plasma chamber, at least one plasma electrode, being electrically insulated from the chamber wall, to which a DC, NF, or HF voltage is applied, and is disposed coaxially to the inner conductor, the plasma electrode contacting the microwave plasma electrically, wherein a microwave power is transported by the microwave line being used for an ionization of the microwave plasma so that a function of the at least one outer conductor is transferred at least partly to the microwave plasma;
selecting the at least one plasma electrode from the group consisting of:
a tubular shaped plasma electrode disposed around the insulating tube being coaxial to the inner conductor and having two plasma electrode elements, each of the plasma electrode elements disposed at one side of the plasma chamber and each ending in an interior of the plasma chamber; and
a single, tubular plasma electrode with a plasma electrode opening formed therein and extending in a longitudinal direction of the tubular plasma electrode; and
adjusting an electrical potential of the microwave plasma by the DC, NF, or HF voltage at the at least one plasma electrode.

18. The method according to claim 17, which further comprises adjusting the electrical potential of the microwave plasma relatively to at least one grounded substrate or relatively to at least one substrate being at a bias potential.

* * * * *